US007928474B2

(12) United States Patent
Lin et al.

(10) Patent No.: US 7,928,474 B2
(45) Date of Patent: Apr. 19, 2011

(54) FORMING EMBEDDED DIELECTRIC LAYERS ADJACENT TO SIDEWALLS OF SHALLOW TRENCH ISOLATION REGIONS

(75) Inventors: Hong-Nien Lin, Taichung (TW); Chih-Hsin Ko, Fongshan (TW); Wen-Chin Lee, Hsin-Chu (TW)

(73) Assignee: Taiwan Semiconductor Manufacturing Company, Ltd.,, Hsin-Chu (TW)

( * ) Notice: Subject to any disclaimer, the term of this patent is extended or adjusted under 35 U.S.C. 154(b) by 168 days.

(21) Appl. No.: 11/839,352

(22) Filed: Aug. 15, 2007

(65) Prior Publication Data

US 2009/0045411 A1 Feb. 19, 2009

(51) Int. Cl.
*H01L 21/02* (2006.01)
(52) U.S. Cl. .................. 257/190; 257/77; 257/E29.104; 257/E29.246
(58) Field of Classification Search .................... 257/190
See application file for complete search history.

(56) References Cited

U.S. PATENT DOCUMENTS

| 4,394,674 | A  | * | 7/1983  | Sakuma et al. | ............... | 257/336 |
| 6,483,158 | B1 | * | 11/2002 | Lee | ............... | 257/408 |
| 7,545,023 | B2 | * | 6/2009  | Chien | ............... | 257/616 |
| 2001/0045604 | A1 |   | 11/2001 | Oda et al. | | |
| 2005/0280052 | A1 | * | 12/2005 | Holz et al. | ............... | 257/288 |
| 2006/0088968 | A1 | * | 4/2006  | Shin et al. | ............... | 438/299 |
| 2007/0018205 | A1 |   | 1/2007  | Chidambarrao et al. | | |

FOREIGN PATENT DOCUMENTS

CN 1805151 A 7/2006

OTHER PUBLICATIONS

Cam, C.L., et al., "A Low Cost Drive Current Enhancement Technique using Shallow Trench Isolation induced Stress for 45-nm node," 2006 Symposium on VLSI Technology Digest of Technical Papers, IEEE, 2 pp.
Ge, C.-H., et al., "Process-Strained Si (PSS) CMOS Technology Featuring 3D Strain Engineering," International Electron Devices Meeting, 2003, IEEE, pp. 73-76.

* cited by examiner

*Primary Examiner* — Lex Malsawma
(74) *Attorney, Agent, or Firm* — Slater & Matsil, L.L.P.

(57) ABSTRACT

A semiconductor structure is provided. The semiconductor structure includes a semiconductor substrate; an insulating region extending from substantially a top surface of the semiconductor substrate into the semiconductor substrate; an embedded dielectric spacer adjacent the insulating region, wherein a bottom of the embedded dielectric spacer adjoins the semiconductor substrate; and a semiconductor material adjoining a top edge and extending on a sidewall of the embedded dielectric spacer.

14 Claims, 6 Drawing Sheets

FORMING EMBEDDED DIELECTRIC LAYERS ADJACENT TO SIDEWALLS OF SHALLOW TRENCH ISOLATION REGIONS

TECHNICAL FIELD

This invention relates generally to integrated circuits, and more particularly to metal-oxide-semiconductor (MOS) devices having stressed channel regions and fabrication methods for forming the same, and even more particularly, to a method of reducing compressive stresses applied by shallow trench isolation regions.

BACKGROUND

With integrated circuits becoming smaller and faster, the improvement in device driving currents of metal-oxide-semiconductor (MOS) devices becomes increasingly more important. Device current is closely related to gate length, gate capacitance, and carrier mobility. Shortening poly-gate length, increasing gate capacitance, and increasing carrier mobility can improve the device current performance. Gate length reduction is an on-going effort coming with the effort to shrink circuit size. Increasing gate capacitance has also been achieved by efforts such as reducing the gate dielectric thickness, increasing the gate dielectric constant, and the like. In order to further improve device current, enhancing carrier mobility has also been explored.

Among efforts made to enhance the carrier mobility, forming stressed channels is a known practice. Stress can enhance bulk mobility of electrons and holes, and hence the performance of MOS devices can be enhanced through stressed-surface channels. This technique allows the performance of MOS devices to be improved at a constant gate length, without adding complexity to circuit fabrication or design.

When silicon is placed under stress, the in-plane, room temperature electron mobility is dramatically increased. One way to develop stress is by using a graded SiGe epitaxy layer as a substrate on which a layer of relaxed SiGe is formed. A layer of silicon is formed on the relaxed SiGe layer. MOS devices are then formed on the silicon layer, which has an inherent stress. Since the lattice constant of SiGe is greater than that of Si, the Si film is under biaxial tension and thus the carriers exhibit stress-enhanced mobility.

Stress in a device may have components in three directions: parallel to the MOS device channel length, parallel to the device channel width, and perpendicular to the channel plane. The stresses parallel to the device channel length and width are called in-plane stresses. Research has revealed that a bi-axial, in-plane tensile stress field can improve the performance of n-type MOS (NMOS), and a compressive stress parallel to the channel length direction can improve the performance of p-type MOS (PMOS device).

Typically, STI regions apply compressive stresses to the channel regions of nearby MOS devices. This is beneficial to the PMOS devices while detrimental to the NMOS devices. In further explorations, local mechanical stress-control technologies have been reported to improve device performance of NMOS devices by using sub-atmospheric chemical vapor deposition (SACVD) to form shallow trench isolation regions. Since the high-shrinkage material in the STI regions reduce the adverse compressive stress applied to the channel regions of NMOS device, the degradation in the performance of NMOS devices is less severe. Other methods to increase desirable stresses or to reduce undesirable stresses in the channel regions are also needed.

SUMMARY OF THE INVENTION

In accordance with one aspect of the present invention, a semiconductor structure includes a semiconductor substrate; an insulating region extending from substantially a top surface of the semiconductor substrate into the semiconductor substrate; an embedded dielectric spacer adjacent the insulating region, wherein a bottom of the embedded dielectric spacer adjoins the semiconductor substrate; and a semiconductor material adjoining a top edge and extending on a sidewall of the embedded dielectric spacer.

In accordance with another aspect of the present invention, a semiconductor structure includes a semiconductor substrate; a shallow trench isolation (STI) region in the semiconductor substrate; a gate stack on a top surface of the semiconductor substrate; and a recess extending from the top surface of the semiconductor substrate into the semiconductor substrate. The recess is between the STI region and the gate stack, and has a first sidewall facing the STI region and a second sidewall facing the gate stack. The semiconductor structure further includes an embedded spacer in the recess and on the first sidewall of the recess; and a semiconductor material filling a remaining portion of the recess.

In accordance with yet another aspect of the present invention, a semiconductor structure includes a semiconductor substrate; a shallow trench isolation (STI) region in the semiconductor substrate; a gate stack on a top surface of the semiconductor substrate; and an epitaxial semiconductor material in a recess of the semiconductor substrate. The semiconductor material is between the STI region and the gate stack. The epitaxial semiconductor material includes a bottom portion having a first sidewall facing the STI region and a second sidewall facing the gate stack. The semiconductor structure further includes an embedded dielectric spacer adjoining the first sidewall of the epitaxial semiconductor material, wherein a top portion of the epitaxial semiconductor material extends on a top edge of the embedded dielectric spacer.

In accordance with yet another aspect of the present invention, a method for forming a semiconductor structure includes providing a semiconductor substrate; forming an insulating region in the semiconductor substrate; etching the semiconductor substrate to form a recess using the insulating region as a mask; forming an embedded dielectric spacer in the recess and on a sidewall of the recess, wherein the sidewall of the recess faces the insulating region; and filling the recess with a semiconductor material.

In accordance with yet another aspect of the present invention, a method for forming a semiconductor structure includes providing a semiconductor substrate; forming a shallow trench isolation (STI) region in the semiconductor substrate; forming a gate stack on the semiconductor substrate and adjacent the STI region; forming a gate spacer on a sidewall of the gate stack, wherein the gate spacer is between the gate stack and the STI region; using the gate stack, the gate spacer and the STI region as a mask to recess an exposed portion of the semiconductor substrate between the gate spacer and the STI region to form a recess; blanket forming a spacer layer, wherein the spacer layer extends into the recess; etching the spacer layer to form an embedded dielectric spacer in the recess; and epitaxially growing a semiconductor material in the recess to form an epitaxial region.

The embedded dielectric spacers formed in the recesses have the advantageous features of blocking undesirable stresses applied to channel regions of MOS devices by the nearby shallow trench isolation regions. The performance of MOS devices is thus improved.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for reducing undesirable stresses in metal-oxide-semiconductor (MOS) devices and the resulting structures are provided. The intermediate stages of manufacturing embodiments of the present invention are illustrated. Throughout the various views and illustrative embodiments of the present invention, like reference numbers are used to designate like elements.

Figure 1:
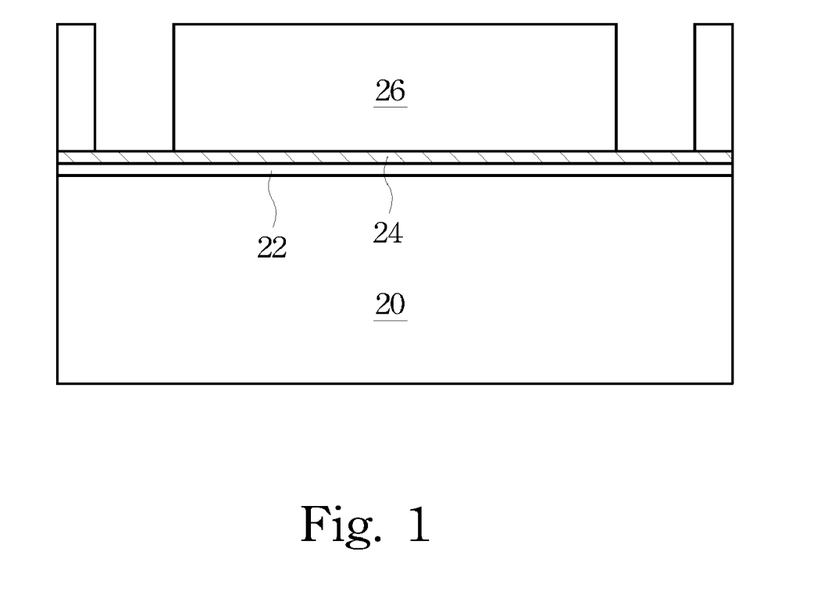
FIGS. 1 through 8 are cross-sectional views of intermediate stages in the manufacturing of an embodiment of the present invention, wherein embedded spacers are formed in recesses adjacent shallow trench isolation regions.

Referring to FIG. 1, substrate 20 is provided. In an embodiment, substrate 20 is a bulk silicon substrate. In other embodiments, substrate 20 comprises silicon germanium, silicon carbon, and the like. In yet other embodiments, substrate 20 has a silicon-on-insulator structure.

Optional pad layer 22 and hard mask layer 24 are formed over substrate 20. Pad layer 22 is preferably a thin oxide film formed through a thermal process, and is preferably used for reducing the stress between substrate 20 and the subsequently formed hard mask layer 24. In the preferred embodiment, hard mask layer 24 is formed of silicon nitride using low-pressure chemical vapor deposition (LPCVD). In other embodiments, hard mask layer 24 is formed of high-density plasma (HDP) nitride or plasma enhanced silicon nitride. In yet other embodiments, hard mask layer 24 is formed by thermal nitridation or plasma anodic nitridation of silicon using nitrogen. Photo resist 26 is formed and patterned over hard mask layer 24.

Figure 2:
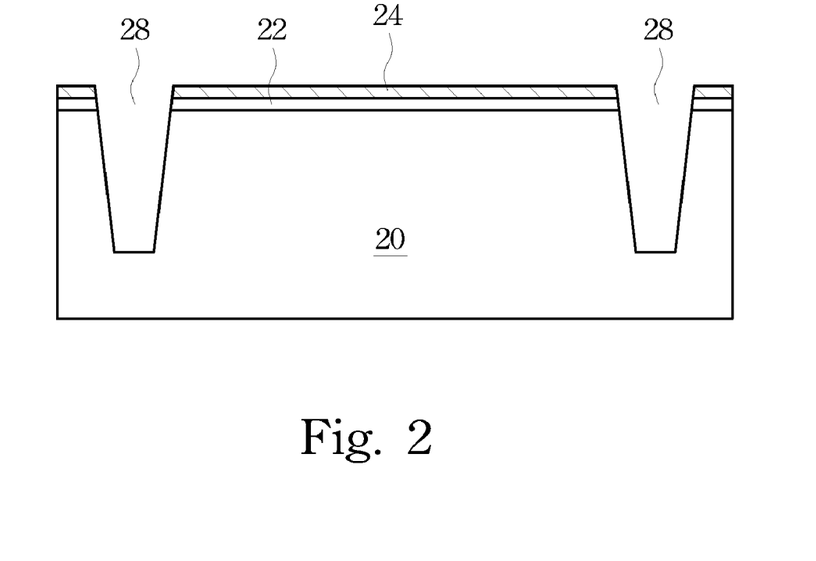

FIG. 2 illustrates the formation of openings 28 in substrate 20, preferably by anisotropic plasma etching using fluorine-containing chemicals. Openings 28 define active regions for forming metal-oxide-semiconductor (MOS) devices. Photo resist 26 is then removed.

Figure 3:
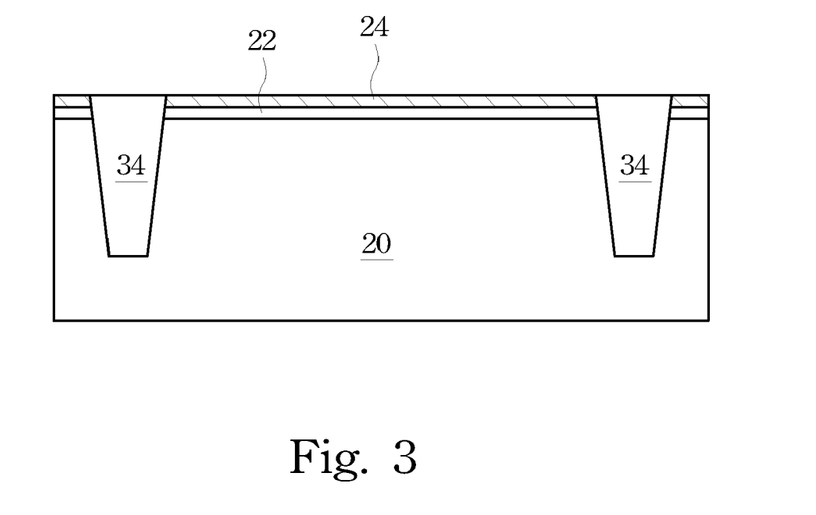

Referring to FIG. 3, a dielectric material is filled into openings 28, followed by a chemical mechanical polish (CMP) to remove excess dielectric material, leaving shallow trench isolation (STI) regions 34 in openings 28. Hard mask layer 24 is used as a CMP stop layer. Preferably, the dielectric material is filled using a high-shrinkage gap-filling process, so that the resulting dielectric material has a high shrinkage rate when annealed. The methods for filling dielectric material is preferably selected from sub-atmospheric chemical vapor deposition (SACVD), high-density plasma deposition processes such as high-density plasma CVD, spin-on, and the like. However, other commonly used methods for forming high-shrinkage dielectric materials can also be used. The process precursors may include tetra ethyl ortho silicate (TEOS), $O_3$, silane, $NH_3$, $N_2$, $H_2$, $O_2$, and combinations thereof.

Figure 4:
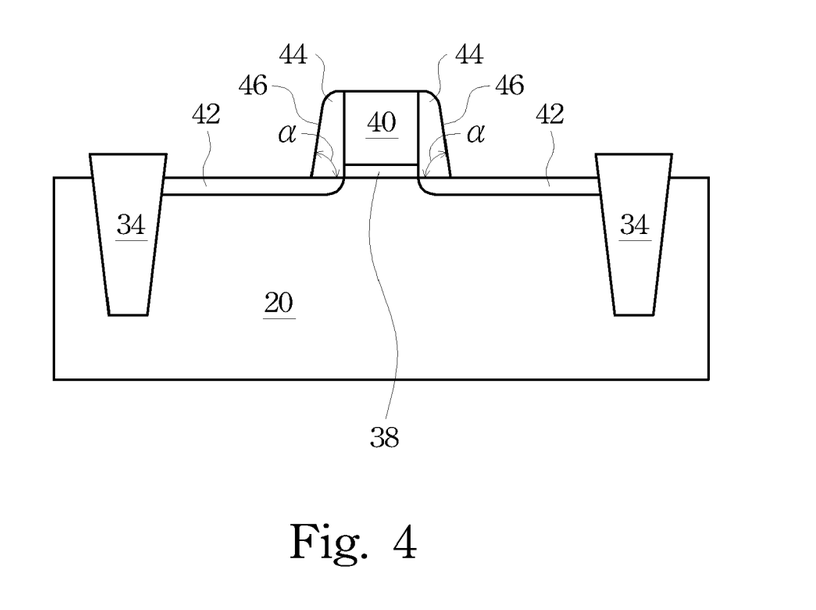

Mask layer 24 and pad layer 22 are then removed, as shown in FIG. 4. Mask layer 24, if formed of silicon nitride, may be removed using a $H_3PO_4$, while pad layer 22 may be removed using diluted HF if it is formed of silicon oxide.

Again referring to FIG. 4, gate dielectric 38 and gate electrode 40 are formed, followed by the formation of lightly doped source/drain (LDD) regions 42. As is known in the art, gate dielectric 38 may include silicon oxide or high-k dielectric materials, and gate electrode 40 may include doped polysilicon or metal-containing conductive materials. The details for forming gate dielectric 38, gate electrode 40, and LDD regions 42 are well known in the art, and thus are not repeated herein. In the preferred embodiment, the resulting MOS device is an NMOS device. Accordingly, LDD regions 42 are preferably doped with n-type impurities, such as phosphorus, arsenic, and combinations thereof. If, however, a PMOS device is to be formed, LDD regions 42 will be doped with p-type impurities.

FIG. 4 also illustrates the formation of dummy spacers 44. As is known in the art, the formation of dummy spacers 44 preferably includes forming a spacer layer, and removing horizontal portions of the spacer layer using dry etching. The side edges 46 of dummy spacers 44 are preferably tilted, with a tilt angle $\alpha$ of less than 90 degrees, and more preferably less than about 75 degrees. Tilt angle $\alpha$ may be reduced by adjusting the structure and/or materials of the spacer layer. Alternatively, tilt angle $\alpha$ is reduced by adjusting the process conditions in the dry etching. Dummy spacers 44 may include materials such as silicon nitride, silicon oxide, and the like, and can be formed using commonly used methods such as plasma enhanced chemical vapor deposition (PECVD).

Figure 5:
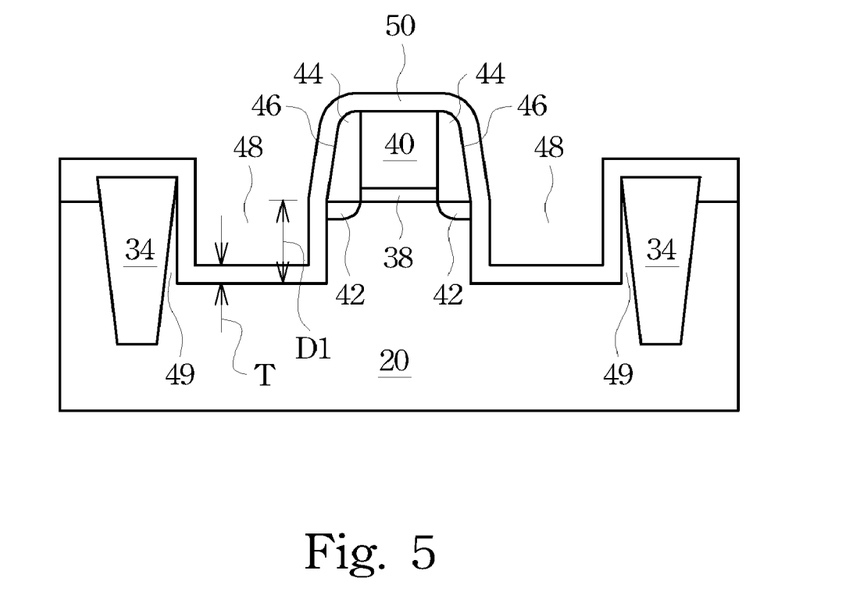

In FIG. 5, the exposed portions of substrate 20 are recessed, forming recesses 48. In an exemplary embodiment, recesses 48 have depth D1 of between about 40 nm and about 100 nm. In the preferred embodiment, the recessing is anisotropic. Since the sidewalls of STI regions 34 are typically slightly tilted, thin substrate regions 49 may remain on sidewalls of STI regions 34. If, however, the sidewalls of STI regions 34 are substantially vertical, substrate regions 49 will be removed during the recessing of substrate 20. In other embodiments, the recessing is isotropic, and hence substrate regions 49 are removed even if the sidewalls of STI regions 34 are tilted. Please note that in the formation of recesses 48, STI regions 34, gate electrode 40, and dummy spacers 44 are used as a mask, hence the formation of recesses 48 is self-aligned. Therefore, the embodiments of the present invention are highly scalable.

Embedded dielectric layer 50 is then blanket formed. Embedded dielectric layer 50 may be formed of commonly used dielectric materials, which preferably have the ability of blocking the compressive stress applied by STI regions 34. Exemplary materials include silicon oxide, silicon oxynitride, tetraethoxysilane (TEOS) oxide, and combinations thereof. Embedded dielectric layer 50 may also be a composite layer including more than one layer, for example, a silicon nitride layer on a TEOS oxide layer. The thickness T of embedded dielectric layer 50 is preferably between about 25 nm and about 85 nm. In an embodiment, embedded dielectric layer 50 is formed of a different dielectric material from dummy spacers 44, so that in the subsequent patterning (and possibly removal) of embedded dielectric layer 50, dummy spacers 44 are substantially intact.

Figure 6A:
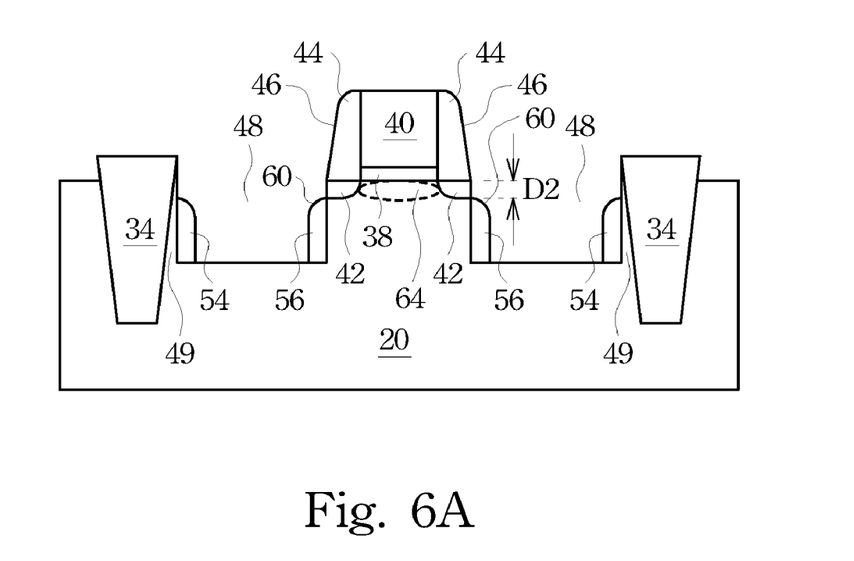
Figure 6B:
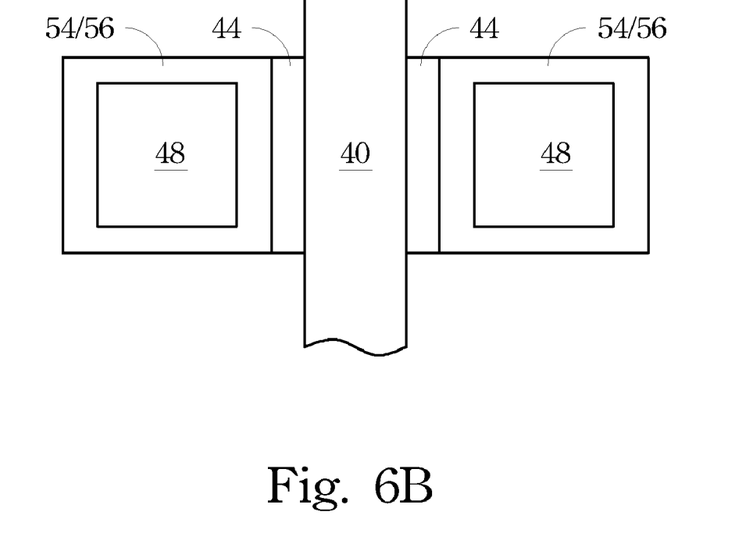
Figure 6C:
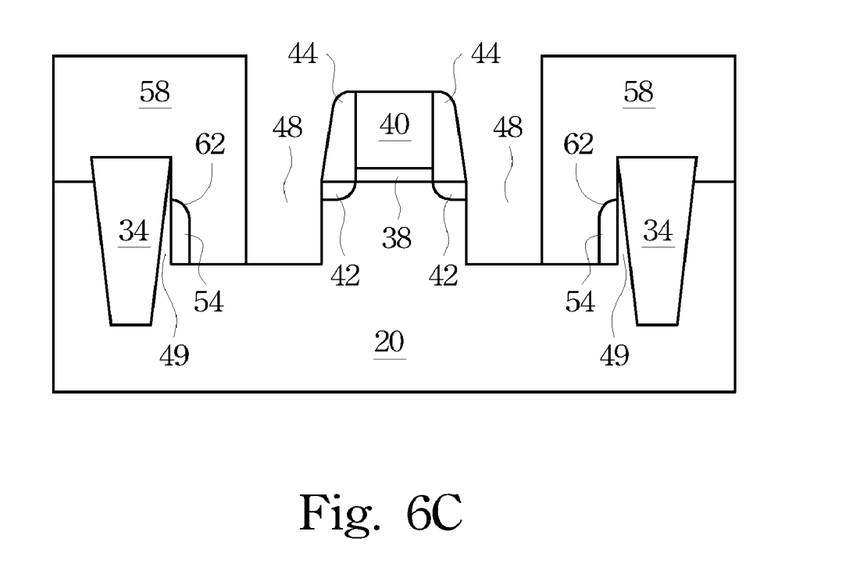

FIGS. 6A through 6C illustrate the formation of embedded spacers 54 and 56. Referring to FIG. 6A, a dry etching is performed to remove horizontal portions of embedded dielectric layer 50, forming embedded spacers 54 and 56. Preferably, the top edges 60 of embedded spacers 56 are lower than the bottom surface of gate dielectric 38 to ensure that the channel region of the resulting MOS device is not electrically insulated from the subsequently formed source/drain regions. More preferably, distance D2 between the top edges 60 of embedded spacers 56 and the bottom surface of gate dielectric 38 is substantially equal to, or greater than the thickness of channel region 61 of the resulting MOS device. In an exemplary embodiment, distance D2 is greater than about 50 Å, and more preferably between about 100 Å and about 350 Å. Advantageously, with dummy spacers 44 having tilted edges 46, the portions of embedded dielectric spacer layer 50 higher than the bottom surface of gate dielectric 38 can be fully removed.

FIG. 6B illustrates a top view of the structure shown in FIG. 6A. Embedded spacers 54 and 56 form a spacer ring encircling a source region of the resulting MOS device, and a spacer ring encircling a drain region of the resulting MOS device.

FIG. 6C illustrates another embodiment. After the formation of embedded spacers 54 and 56, photo resist 58 is formed to mask embedded spacers 54, leaving embedded spacers 56 exposed. An etching, which is preferably a wet etching, is then performed to remove embedded spacers 56. In this embodiment, top edges 62 of embedded spacers 54 may be slightly lower than the bottom surface of gate dielectric 38. More preferably, top edges 62 are either substantially level with, or higher than, the bottom surface of gate dielectric 38 to achieve better stress blocking ability.

In the embodiment substrate regions 49 are removed (refer to FIG. 5), embedded spacers 54 physically contact the sidewall of STI regions 34. Otherwise, embedded spacers 54 directly contact sidewalls of substrate regions 49.

Figure 7:
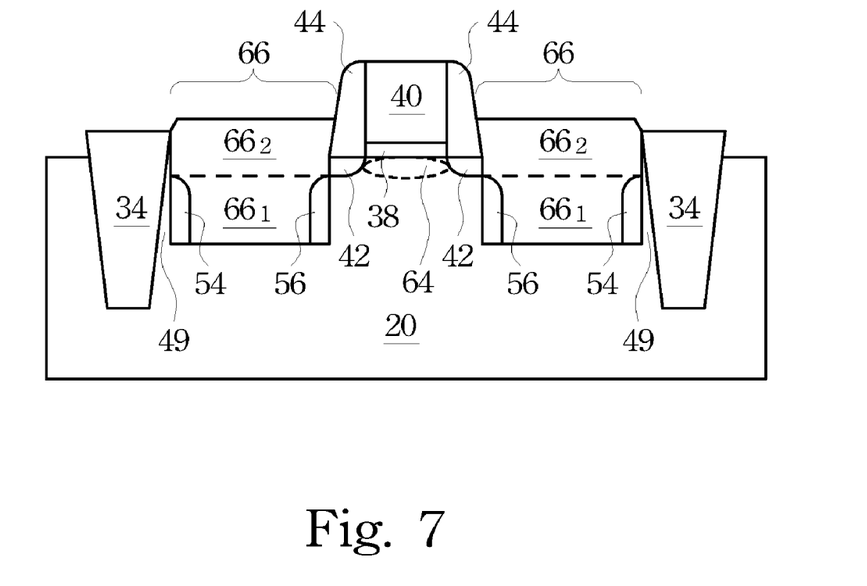

FIG. 7 illustrates the growth of epitaxial regions 66 in recesses 48, preferably using selective epitaxial growth (SEG). In an embodiment, substantially pure silicon may be grown in recesses 48. Desirable impurities, preferably n-type impurities, may be doped when the epitaxial growth proceeds. Elements that can change the lattice constant of epitaxial regions 66 are preferably added in order to apply a desirable stress to the channel region 64 of the resulting MOS device. In the preferred embodiment, silicon carbon is epitaxially grown in recesses 48, wherein the atomic percentage of carbon is preferably between about 1 percent and about 2 percent. Alternatively, SiGe is grown in recesses 48, wherein the germanium atomic percentage is preferably between about 10 percent and about 25 percent.

The epitaxial growth of epitaxial regions 66 may be performed in a single step. Alternatively, a two-step growth is performed. Epitaxial regions $66_1$ (bottom portions of epitaxial regions 66), which have top surfaces substantially level with the top edges of the embedded spacers 56 and/or 54, are first formed. Process conditions are then changed to form epitaxial regions $66_2$ (top portions of epitaxial regions 66). In a first embodiment, the formation of epitaxial regions $66_1$ is specifically tuned to reduce the dislocations. In a second embodiment, epitaxial regions $66_1$ have a lower carbon atomic percentage than epitaxial regions $66_2$, so that a greater tensile stress is applied to channel region 64 by epitaxial regions 66. Preferably, epitaxial regions 66 have top surfaces higher than the bottom surface of gate dielectric 38.

Figure 8:
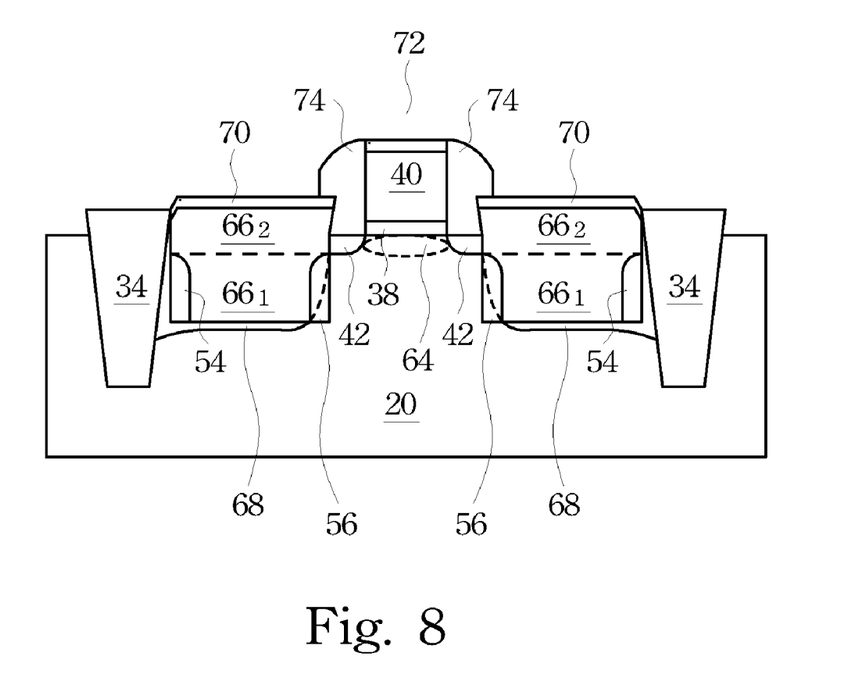

In FIG. 8, dummy spacers 44 are removed, followed by the formation of gate spacers 74. Preferably, gate spacers 74 have a greater thickness than the dummy spacers 44. Alternatively, spacers 44 are left in the final structure. Source and drain regions 68 and source/drain silicide regions 70 are then formed. As is known in the art, to form an NMOS device, the source/drain regions 68 are implanted with n-type impurities, while the formation of a PMOS device requires the implantation of p-type impurities. The formation of source/drain silicide regions 70 includes blanket forming a metal layer, performing an annealing to react the metal layer with the underlying silicon, and removing the un-reacted metal layer. MOS device 72 is thus formed. The details for forming source/drain regions 68 and source/drain silicide regions 70 are well known in the art, and hence are not repeated herein.

Figure 9:
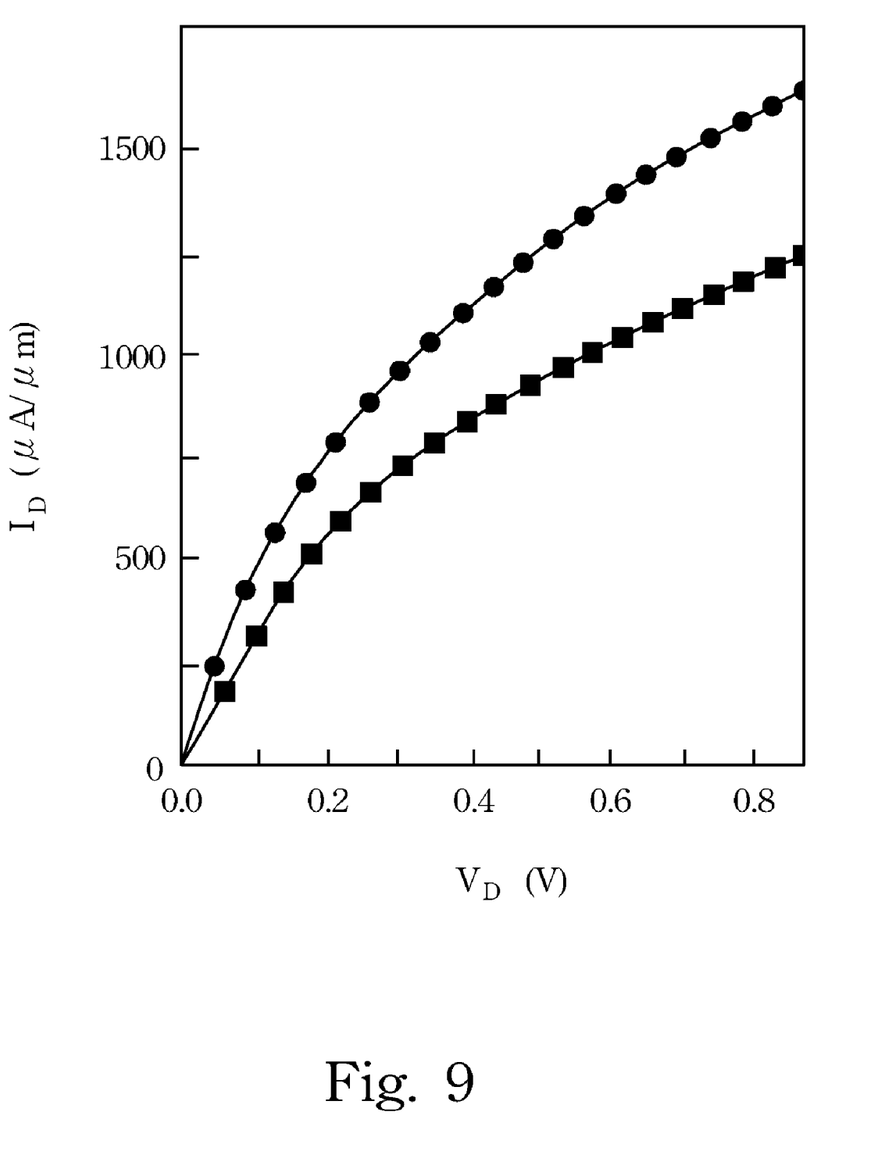
FIG. 9 illustrates simulated I-V curves.

STI regions 34 typically apply a compressive stress to the channel region 61 of MOS device 72. Advantageously, for NMOS devices, by forming STI regions 34 with high shrinkage materials using SACVD and the like, the adverse compressive stress applied by STI regions 34 is reduced. The embedded spacers 54 and 56 have the advantageous features of blocking the adverse compressive stress, which were proven by simulation results. Further, simulation results performed on the NMOS devices revealed that the embodiments of the present invention have improved drive currents and leakages currents due to the blockage of the adverse compressive stress. FIG. 9 illustrates an I-V curve of a first sample MOS device (solid circles) including embedded spacers 54, and a second sample MOS device (solid squares) having similar structure as the first sample MOS device except that the second sample device has no embedded spacers 54. It can be found from FIG. 9 that the drive current of the first sample device is significantly higher than that of the second sample device. In further simulations, it was found that at the same operating conditions, the first sample MOS device has a drain-source leakage current of about 132 nA/μm, while the drain-source leakage current of the second sample MOS device is about 1267 nA/μm, which is one order greater than the first sample device. This may partially due to the reason the formation of the embedded spacer reduces the junction leakage currents along the sidewalls of the STI regions.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
   a semiconductor substrate;
   an insulating region extending from substantially a top surface of the semiconductor substrate into the semiconductor substrate;
   an embedded dielectric spacer adjacent the insulating region, wherein a bottom of the embedded dielectric spacer adjoins the semiconductor substrate, wherein an edge of the embedded dielectric spacer is substantially vertically aligned to a top tip of the insulating region, wherein the semiconductor structure further comprises a semiconductor layer horizontally between and adjoining the insulating region and the embedded dielectric spacer, and wherein the semiconductor layer and the semiconductor substrate are formed of a same material; and a semiconductor material adjoining a top edge and extending on a sidewall of the embedded dielectric spacer, wherein the semiconductor material comprises:
   a bottom portion comprising a top surface level with the top edge of the embedded dielectric layer; and
   a top portion comprising a bottom surface contacting the top surface of the bottom portion, wherein the top portion and the bottom portion comprise silicon carbon, and wherein the top portion has a higher carbon atomic percentage than the bottom portion.

2. The semiconductor structure of claim 1, wherein the embedded dielectric spacer forms a ring.

3. The semiconductor structure of claim 1 further comprising an additional dielectric embedded spacer adjacent a MOS device, wherein the additional embedded dielectric spacer and the embedded dielectric spacer are spaced apart by a source/drain region of the MOS device.

4. The semiconductor structure of claim 3, wherein the embedded dielectric spacer and the additional embedded dielectric spacer comprise a same material.

5. A semiconductor structure comprising:
   a semiconductor substrate;
   a shallow trench isolation (STI) region in the semiconductor substrate;
   a gate stack on a top surface of the semiconductor substrate;
   a recess extending from the top surface of the semiconductor substrate into the semiconductor substrate, wherein the recess is between the STI region and the gate stack, and wherein the recess has a first sidewall and a second sidewall, with the first sidewall being closer to the STI region than the second sidewall, and the first and the second sidewalls being opposite sidewalls of the recess;
   an embedded spacer in recess and on the first sidewall of the recess, and wherein no embedded spacer is on the second sidewall of the recess; and
   a semiconductor material filling a remaining portion of the recess.

6. The semiconductor structure of claim 5, wherein the semiconductor material has a top surface higher than the embedded spacer.

7. The semiconductor structure of claim 5, wherein the embedded spacer has a top edge lower than a bottom surface of the gate stack.

8. The semiconductor structure of claim 5 further comprising a lightly doped source/drain region horizontally between the second sidewall of the recess and a respective edge of the gate stack, and a source/drain region having at least a portion in the semiconductor material.

9. The semiconductor structure of claim 5, wherein the semiconductor material has a lattice constant less than a lattice constant of the semiconductor substrate.

10. A semiconductor structure comprising:
   a semiconductor substrate;
   a shallow trench isolation (STI) region in the semiconductor substrate;
   a gate stack on a top surface of the semiconductor substrate;
   an epitaxial semiconductor material in a recess of the semiconductor substrate, wherein the epitaxial semiconductor material is between the STI region and the gate stack, and wherein the epitaxial semiconductor material comprises a first sidewall and a second sidewall, with the first sidewall being closer to the STI region than the second sidewall, and the first and the second sidewalls being opposite sidewalls of the recess; and
   an embedded dielectric ring comprising:
      a first embedded dielectric spacer adjoining the first sidewall of the epitaxial semiconductor material, wherein a top portion of the epitaxial semiconductor material extends on a top edge of the first embedded dielectric spacer; and
      a second embedded dielectric spacer adjoining the second sidewall of the epitaxial semiconductor material, wherein a portion of the epitaxial semiconductor material laterally between the first and the second embedded dielectric spacers comprises a bottom surface contacting the semiconductor substrate; and
   a thin layer of the semiconductor substrate between and contacting a sidewall of the first embedded dielectric spacer and a sidewall of the STI region, wherein an interface between the thin layer of the semiconductor substrate and the first embedded dielectric spacer is vertically aligned to a top tip of the STI region.

11. The semiconductor structure of claim 10, wherein the second embedded dielectric spacer has a top edge lower than a bottom surface of the gate stack, and wherein the epitaxial semiconductor material extends on the top edge of the second embedded dielectric spacer.

12. The semiconductor structure of claim 11, wherein the top edge of the second embedded dielectric spacer is no higher than a channel region underlying the gate stack.

13. The semiconductor structure of claim 10, wherein the second embedded dielectric spacer is horizontally spaced apart from an edge of the gate stack by a lightly doped source/drain region.

14. The semiconductor structure of claim 10, wherein the semiconductor substrate comprises silicon, and wherein the epitaxial semiconductor material comprises silicon carbon.

* * * * *